United States Patent [19]

Lincoln

[11] 3,795,492

[45] Mar. 5, 1974

[54] LANCED AND RELIEVED LEAD STRIPS

[75] Inventor: Milan L. Lincoln, Scottsdale, Ariz.

[73] Assignee: Motorola, Inc., Franklin Park, Ill.

[22] Filed: Oct. 9, 1970

[21] Appl. No.: 79,602

[52] U.S. Cl. .............................................. 29/193.5
[51] Int. Cl. ............................................. B23d 81/00
[58] Field of Search ...................................... 29/193.5

[56] References Cited

UNITED STATES PATENTS

| | | | |
|---|---|---|---|
| 3,317,287 | 5/1967 | Caracciolo | 29/193.5 X |
| 3,436,810 | 4/1969 | Kauffman | 29/577 |
| 3,440,027 | 4/1969 | Hugle | 29/193.5 |
| 3,469,684 | 9/1969 | Keady et al. | 29/193.5 X |
| 3,469,953 | 9/1969 | St. Clair et al. | 29/193.5 |
| 3,537,175 | 11/1970 | St. Clair et al. | 29/193.5 X |
| 3,544,857 | 12/1970 | Byrne et al. | 29/193.5 X |
| 3,550,766 | 12/1970 | Nixen et al. | 29/193.5 X |
| 3,597,666 | 8/1971 | Taskovich | 29/193.5 X |
| 3,611,061 | 10/1971 | Segerson | 29/193.5 X |
| 3,627,901 | 12/1971 | Happ | 29/193.5 X |

*Primary Examiner*—A. B. Curtis
*Assistant Examiner*—O. E. Crutchfield

[57] ABSTRACT

The supporting bar of a lead frame is cut through before the encapsulation of the semiconductor device which is electrically connected to the inner ends of the leads comprising the lead frame. To keep the so cut frame flat and smooth, relief slots are provided in the strip to receive the portions of the strip that is lengthened by the cutting action.

8 Claims, 2 Drawing Figures

Figure 1:
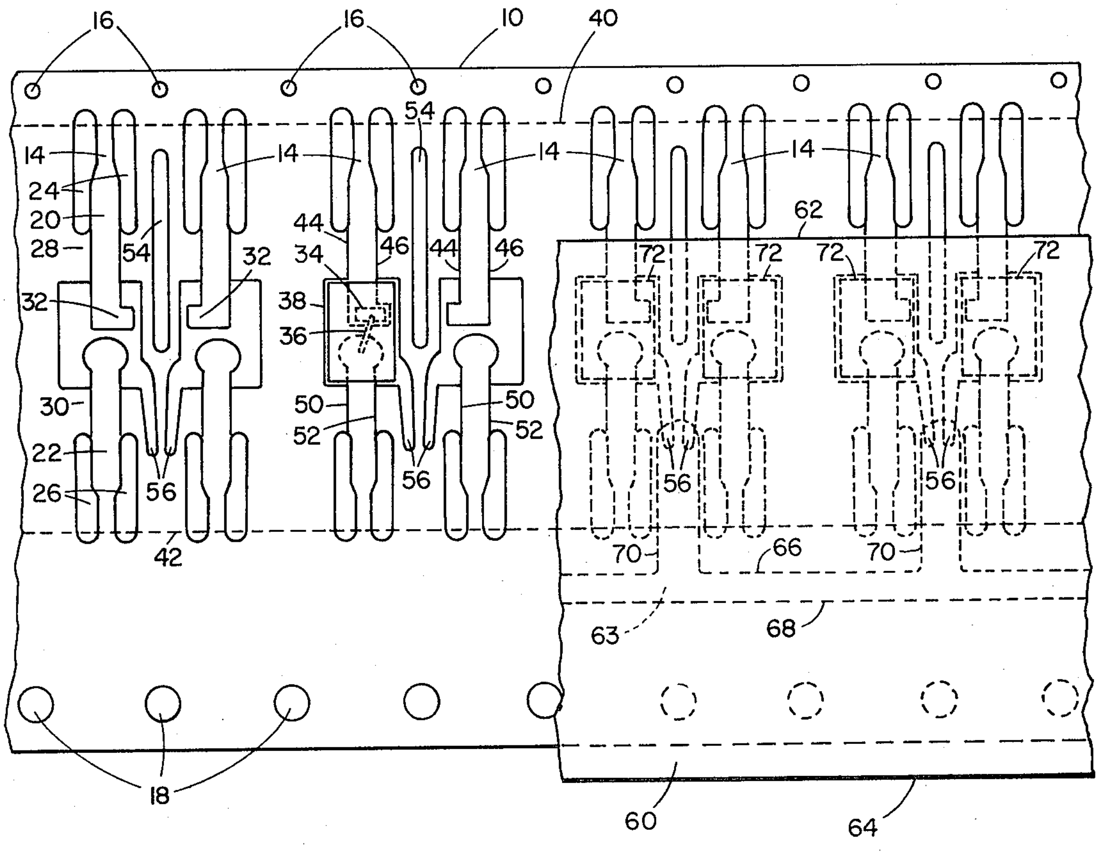

INVENTOR.

Milan L. Lincoln

BY

Mueller & Aichele

ATTY'S.

LANCED AND RELIEVED LEAD STRIPS

BACKGROUND

This invention relates to a lead frame and to a method of providing an encapsulated semiconductor device including such lead frames.

It is known to provide a strip of lead frames and to connect the bonding pad or pads on a semiconductor device to respective leads of the lead frame, and in some cases to mount the semiconductor device or chip on and to electrically connect the chip to one of the leads of the lead frame. Then the strip of lead frames, with the chips electrically connected to the respective leads thereof, are encapsulated by molding, that is, the chip and the inner ends of the leads connected thereto are put in a mold chamber or cavity and encapsulating material in a fluid state is forced into each cavity. To close the mold down about the separate leads is difficult. In accordance with the prior art, a support bar or bars are provided joining the lead or leads of a frame and also the leads of adjacent frames just at the outside of the completely encapsulated chip to form a closure for the mold between adjacent leads and adjacent lead frames to prevent leakage of the fluid. This support bar comprises a part of the sheet from which the strip of lead frames is made and therefore would, if not removed, short circuit the leads. Therefore, the support bar or bars must be removed. In accordance with the prior art, after the encapsulation is completed, the support bar is cut away by use of punches. The complete encapsulated device is very small, about 1/8 of an inch by about 3/16 of an inch in dimensions and the support bar or bars may be about 1/16 of an inch wide and may run very close to the edge of the encapsulated device, whereby the punches to cut the bars must be very small and they often either damage the encapsulation, destroying the encapsulated device or they are themselves broken in the process of cutting the support bars, whereby the punches require replacement.

In the process of encapsulating, fluid encapsulating material is forced into a mold cavity through a gate, that is, a special channel called a gate is provided in the mold to lead the encapsulating material into the mold cavity, adding expense to the mold.

It is an object of this invention to provide an improved frame strip for producing an encapsulated semiconductor device.

It is a further object of this invention to provide a means whereby the support bar need not be cut through after encapsulation in providing an encapsulated semiconductor device.

It is an object of this invention to provide a frame having pre-cut support bars and relief slots and in which the relief slots act as gates for encapsulating fluid whereby no gate in the mold cavity is required for the admission thereinto of encapsulating material.

SUMMARY

In accordance with this invention, the support bars of a strip of lead frames are cut through before the encapsulation of the semiconductor chip which is connected to the leads of the frame, however, the pieces of the support bars are retained in place until encapsulation is completed after which they may be discarded. As another feature of this invention, relief slots are cut into the lead frame to provide space into which the expanded metal, which is produced when the lead frames are cut through, can expand. The expansion slots prevent wrinkling of the lead frames. As still a further feature of this invention, the expansion slots may be used as gates for the fluid encapsulating material when it is being forced into the mold cavity.

DESCRIPTION

Figure 2:
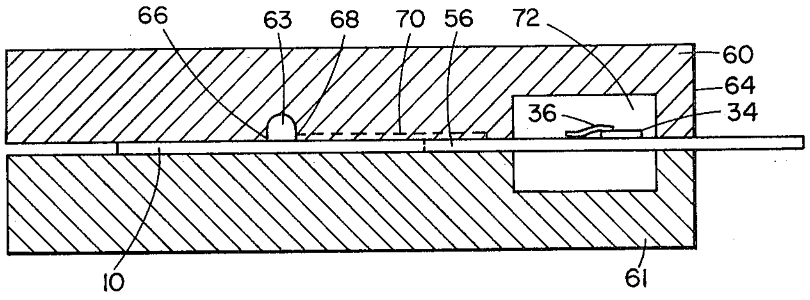

The invention will be better understood upon reading the following description in connection with the accompanying drawing in which:

FIG. 1 shows a portion of a strip of lead frames in accordance with this invention and also illustrates the position of a mold member with respect thereto, and FIG. 2 is a section of FIG. 1 showing the relative position of the mold cavities and the leaders with respect to the lead frame strip of FIG. 1.

A strip 10 of lead frames 14 is provided. In the strip 10 as shown, the lead frames 14 are for a diode whereby only two leads are provided per frame. Also, while not important to this invention the lead frames 14 are arranged in pairs, the lead frames of a pair facing each other. Obviously, more leads may be provided per frame so that other semiconductor chips such as integrated circuits or transistors may be encapsulated, the leads of the frame may all extend in the same direction instead of being in opposite directions or the leads may be extended in any convenient direction, and the frames need not be arranged in pairs. The strip may be of mild steel about 10 mils thick and the strip may be gold plated, but other suitable conductive materials and thicknesses thereof may be used.

The strip 10 has indexing holes 16 along one edge thereof and other indexing holes 18 along the other edge thereof. The holes 16 are smaller than the holes 18 so that the strip will be properly oriented in the various process steps to which it is subjected. The number, positioning or relative size of the indexing holes is not important to this invention.

Each frame 14 consists of an upper lead 20 and a lower lead 22 which extend towards each other. Slots 24 and 26 are formed in the strip 10 to provide the lead 20 and the lead 22 respectively. The leads 20 and 22 are integral with respective support bars 28 and 30, which extend along the length of the strip 10. The inner ends 32 of the top leads 20 of two adjacent frames 14 extend towards each other, the ends 32 acting as supports for and as a connection to a chip 34, as shown. A bonding pad on the other side of the chip 34 is also shown connected to the lead 22 by a bonding wire 36. When completely encapsulated with encapsulating material, in accordance with the prior art, the encapsulation will be inside of the rectangle 38, with the bars 28 and 30 intact. After all the chips 34 and the connections 36 have been positioned and connected as shown for all the lead frames 14 of a strip 10, and all the encapsulation is completed, usually in one step, according to the prior art, support bars 28 and 30 are cut as on the lines 44, 46, 50 and 52. Then the end bars are cut through as on the dotted lines 40 and 42 to provide the completed encapsulated semiconductor device with leads 20 and 22 extending from opposite ends thereof. However, as noted above, cutting through the bars 28 and 30 after encapsulation is completed often causes breakage of the encapsulation of the chip or breakage of the cutting punches. Therefore, according to the invention, the bars 28 and 30 are cut through on the lines 44, 46, 50 and 52 at the same time that the strip 10 is stamped out, but the leads 20 and 22 and the severed parts of the cross bars 28 and 30 remain in place, that is, in the same plane. The bars 28 and 30, though slit in many places along the lines 44, 46, 50 and 52, will still act if they were not cut.

However, no matter how sharp the cutting punch that cuts the slits 44, 46, 50 and 52, the metal of the bars 28 and 30 will be expanded by the act of cutting. This expansion of the bars 28 and 30 will cause wrinkling of the strip 10 since the portions thereof above and below the lines 40 and 42 are not expanded, preventing matching lengthening of the opposite edges of the strip. This wrinkling makes proper molding of the semiconductor device very difficult. Therefore, further in accordance with this invention, the slots 54 are provided in the strip 10 between the two slits 44 and 46 of two successive frames 14, 14 of a pair of frames and the two slots 56, 56 are provided between the two slits 50 and 52 of two successive frames 14, 14 of a pair of frames. The expansion of the metal of the strip 10 caused by the cutting of the two adjacent pairs of slits 44 and 46 is taken up by narrowing the slot 54 therebetween and the expansion of the metal of the strip 10 caused by cutting the slits 50 and 52 is taken up by the slot 56, nearest thereto, whereby the strip 10 is not wrinkled.

The encapsulating material is forced in fluid form into the chamber or cavity of a mold which surrounds the inner ends of the leads 20 and 22 as well as the chip 34 and the connections thereto 36. It will be noted that the slots 56 open into or communicate with the open area in the strip 10 surrounding the inner ends of the leads 20 and 22. Therefore, by proper construction of the mold comprising the mold members 60 and 61 and shown in FIGS. 1 and 2, the slots 56 can be used as gates through which the fluid molding material flows into the space surrounding the inner ends of the leads 20 and 22. For example, the upper mold member 60 may extend between the lines 62 and 64. A main path or leader 63 for the encapsulating fluid may extend between dotted lines 66 and 68 and branch leaders 70 may be formed connecting the main leader 63 to the slots 56. It will be noted that the slots 56 join or lead fluid from the branch leader 70 to the mold chamber or cavities 72.

In accordance with this invention and using the here disclosed strip 10, when the cuts are made on the lines 40 and 42 of the completed encapsulated semiconductor, no cutting of the bars 28 or 30 is required but the completed encapsulated semiconductor device will be provided by mere separation thereof from the unused part of the strip 10.

While only two leads are shown in the frame 10 and they extend towards each other, any desired number of leads with any desired spacial relation thereof and of any desired shape and structural relation may be used, there being support bars in the same plane with the leads and the support bars being cut at the edges of the leads and, if desired, relief slots being provided between the cuts, one or more of said relief slots communicating, if desired, with the open space in the frame surrounding the inner ends of the slots.

What is claimed is:

1. A metal lead frame strip in a single piece for use in the fabrication of plastic encapsulated semiconductor devices having a plurality of sets of leads defined therein for ultimate separation from the strip and spaced apart longitudinally over the length of such strip with each said set adapted to provide metal parts for the fabrication of a single semiconductor device, each said lead in a set having an inner end portion and an outer end portion, an opening provided in the strip in which said inner end portions are positioned free of the strip at said opening, and with the outer end portions of said leads in a set being integral with the metal strip, said metal strip having a support bar portion with an aperture therein extending over a part of the length of a lead and a slit cut in the metal strip when the metal strip is manufactured between a support bar portion and the lead over the remaining length of that lead, with said support bar portion and lead at each slit remaining in the same plane and in the same position relative to one another after the slit is cut, slot means in the strip in the proximity of a slit adapted to accommodate the expansion of the metal strip when a slit is cut in the metal strip and to prevent wrinkling of the metal of the strip, which wrinkling would interfere with fabrication steps in fabricating semiconductor devices on the strip, and with the metal strip and the outer end portions of the leads in a set adapted to be severed after plastic encapsulation at the inner end portions of a set of leads, whereby the resulting encapsulated semiconductor device and the unused portion of metal strip are separated from one another without any other severing action.

2. A metal lead frame strip as defined in claim 1 wherein the slot means for one set of leads includes an elongated slot provided in the metal strip, and another slot provided in the metal strip extending out of said opening in the strip, with each slot adapted to accommodate the expansion of metal when the metal strip is cut for slits adjacent said leads.

3. A metal lead frame strip as defined in claim 2 wherein the slot extending out of said opening is adapted to communicate with said opening when said strip is mounted in a mold and the inner end portions of the leads in a set are positioned in a cavity in that mold, said communicating being for the purpose of permitting the flow of plastic through said slot into the mold cavity for the plastic encapsulation of a semiconductor device at said inner end portions.

4. A metal lead frame strip in a single piece for use in the fabrication of plastic encapsulated semiconductor devices having a plurality of sets of leads defined therein for ultimate separation from the strip and spaced apart longitudinally over the length of such metal strip, with each said set of leads adapted to provide metal parts for the fabrication of a single semiconductor device, each said lead in a set having an inner end portion and an outer end portion, with the metal strip having an opening therein in which said inner end portion is positioned free of the metal at said opening and with the outer end portion of said lead being integral with the metal strip, said metal strip when it is manufactured having apertures therein extending over a part of the length of said lead with one on each side thereof and having a slit cut therein at each side of the lead over the length of that lead between said aperture and said opening, with said slits defining that lead over the lengths of said slits, and with said lead and said metal strip each remaining in the same plane relative to one another after the slits are cut and during the fabrication of semiconductor devices with the metal strip, slot means in the metal strip in the proximity of a slit adapted to accommodate the expansion of the metal strip when a slit is cut therein and to prevent wrinkling of the metal of the strip, which wrinkling would interfere with fabrication steps in fabricating semiconductor devices on the strip, and with the outer end portion of said lead in a set and the metal strip adapted to be severed from one another after plastic encapsulation at the inner end portion said lead, with the resulting encapsulated semiconductor device and the unused portions of the metal strip being thereby separated from one another without any other severing action.

5. A metal lead frame strip as defined in claim 4, wherein each said set of leads includes at least two leads, each of which lead has an inner end portion and an outer end portion, with the inner end portions of said two leads positioned in said opening in the metal strip, and slits cut in the metal strip define each lead on each side thereof from a point at said opening outwardly a distance along said sides of each lead, with each lead over the length of the slits and said metal strip both remaining in the same plane relative to one another after the slits are cut and during the fabrication of semiconductor devices with the metal strip.

6. A metal lead frame strip as defined in claim 5, wherein said outer end portions of said leads in a set are each integral with said metal strip, and the second lead in a set has an aperture on each side corresponding to said apertures on each side of said lead defined in claim 4 extending outwardly from said slits defining said second lead.

7. A metal lead frame strip as defined in claim 6 wherein said opening has a slot extending therefrom and communicating therewith for acting as a gate when the metal strip is combined with a mold through which to flow liquid plastic when encapsulating the inner end portion of a lead at the opening in the metal strip.

8. A metal lead frame strip as defined in claim 6 wherein each set of leads comprises said two leads with the inner end portion of each positioned in said opening, and each said lead extending away from one another in opposite directions from said opening, and said two leads providing the leads for a diode semiconductor device fabricated on said metal strip.

* * * * *